(12) United States Patent
Wang et al.

(10) Patent No.: US 8,507,177 B2
(45) Date of Patent: *Aug. 13, 2013

(54) PHOTORESIST MATERIALS AND PHOTOLITHOGRAPHY PROCESSES

(75) Inventors: Hsien-Cheng Wang, Hsinchu (TW); Chin-Hsiang Lin, Hsin-Chu (TW); Heng-Jen Lee, Hsin-Chu (TW); Ching-Yu Chang, Yilang County (TW); Hua-Tai Lin, Hsin-Chu (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/050,305

(22) Filed: Mar. 17, 2011

(65) Prior Publication Data
US 2011/0165515 A1    Jul. 7, 2011

Related U.S. Application Data

(63) Continuation of application No. 11/462,413, filed on Aug. 4, 2006, now Pat. No. 7,972,761.

(51) Int. Cl.
    *G03F 7/004*     (2006.01)
    *G03F 7/30*     (2006.01)
    *G03F 7/039*     (2006.01)

(52) U.S. Cl.
    CPC ............ *G03F 7/0397* (2013.01); *G03F 7/30* (2013.01); *Y10S 430/106* (2013.01); *Y10S 430/111* (2013.01)
    USPC ........ 430/270.1; 430/326; 430/330; 430/905; 430/910

(58) Field of Classification Search
    CPC ................................ G03F 7/0397; G03F 7/30
    USPC ................ 430/270.1, 326, 330, 905, 910
See application file for complete search history.

(56) References Cited

U.S. PATENT DOCUMENTS

| | | | |
|---|---|---|---|
| 5,558,977 A | 9/1996 | DePalma et al. | |
| 6,783,914 B1 | 8/2004 | Fedynyshyn | |
| 7,087,691 B2 | 8/2006 | Rhodes et al. | |
| 7,097,958 B2 * | 8/2006 | Sugano et al. | ............ 430/280.1 |
| 7,402,782 B2 | 7/2008 | Iwaki | |
| 2002/0094488 A1 * | 7/2002 | Imai et al. | ................. 430/270.1 |
| 2004/0110085 A1 | 6/2004 | Iwai et al. | |
| 2005/0095530 A1 | 5/2005 | Hosaka et al. | |
| 2006/0096976 A1 | 5/2006 | Iwaki | |
| 2007/0077517 A1 | 4/2007 | Chang | |

OTHER PUBLICATIONS

Sukhendu Mandal et al., "Inorganic-Organic Hybrid Compounds: Synthesis, Structure, and Magnetic Properties of the First Organically Templated Iron Oxalate-Phosphite, [C4N2H12][Fe112(HPO3)2(C2O4)3], Poseessing Infinite Fe—O—Fe Chains", Chem. Mater 2005, 17, 2912-2917.

N.J.O. Silva et al., "Magnetic Behavior of Iron (III) Oxyhydroxy Nanoparticles in Organic-Inorganic Hybrid Matrices", Journal of Magnetism and Magnetic Materials 290-291 (2005) 962-965.

Sukhendu Mandal et al., "Inorganic-Organic Hybrid Structure: Synthesis, Structure and Magnetic Properties of a Cobalt Phosphite-Oxalate, [C4N2H12][Co4(HPO3)2(C2O4)3]", Journal of Solid State Chemistry 178, 92005, 2376-2382.

Taiwanese Patent Office Action, Office Action of May 10, 2010, Application No. 095142454, 7 pages.

* cited by examiner

*Primary Examiner* — John Chu
(74) *Attorney, Agent, or Firm* — Haynes and Boone, LLP

(57) ABSTRACT

A material for use in lithography processing includes a polymer that turns soluble to a base solution in response to reaction with acid and a plurality of magnetically amplified generators (MAGs) each having a magnetic element and each decomposing to form acid bonded with the magnetic element in response to radiation energy.

19 Claims, 4 Drawing Sheets

PHOTORESIST MATERIALS AND PHOTOLITHOGRAPHY PROCESSES

PRIORITY DATA

This continuation application claims priority to application Ser. No. 11/462,413, filed on Aug. 4, 2006, entitled "NOVEL PHOTORESIST MATERIALS AND PHOTOLITHOGRAPHY PROCESSES," the entire disclosure of which is incorporated herein by reference.

BACKGROUND

When the minimum feature size of an integrated circuit (IC) shrinks to 250 nm or less, traditional photolithography technology has various difficulties to achieve high resolution in photoresist patterning. For example, shorter wavelength light such as deep ultraviolet (DUV) including 248 nm UV by krypton fluoride (KrF) excimer lasers and 193 nm UV by argon fluoride (ArF) excimer lasers are employed to realize patterning integrated circuit features much smaller, such as those in 130 nm, 90 nm, and 65 nm technology nodes. However, DUV radiation is not compatible with many different types of photoresist. Correspondingly, a new type of photoresist material, referred to as chemical amplified resists (CAR), has been adopted for use with DUV. However, in CAR, photo generated acid in exposed regions often diffuses into unexposed regions, causing blurring of the latent image and resulting in lateral bias of the exposed image.

It is desired to provide a new and improved system and process for supporting DUV and other types of photolithography. It is also desired to provide new photoresist materials that overcome one or more problems associated with conventional materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
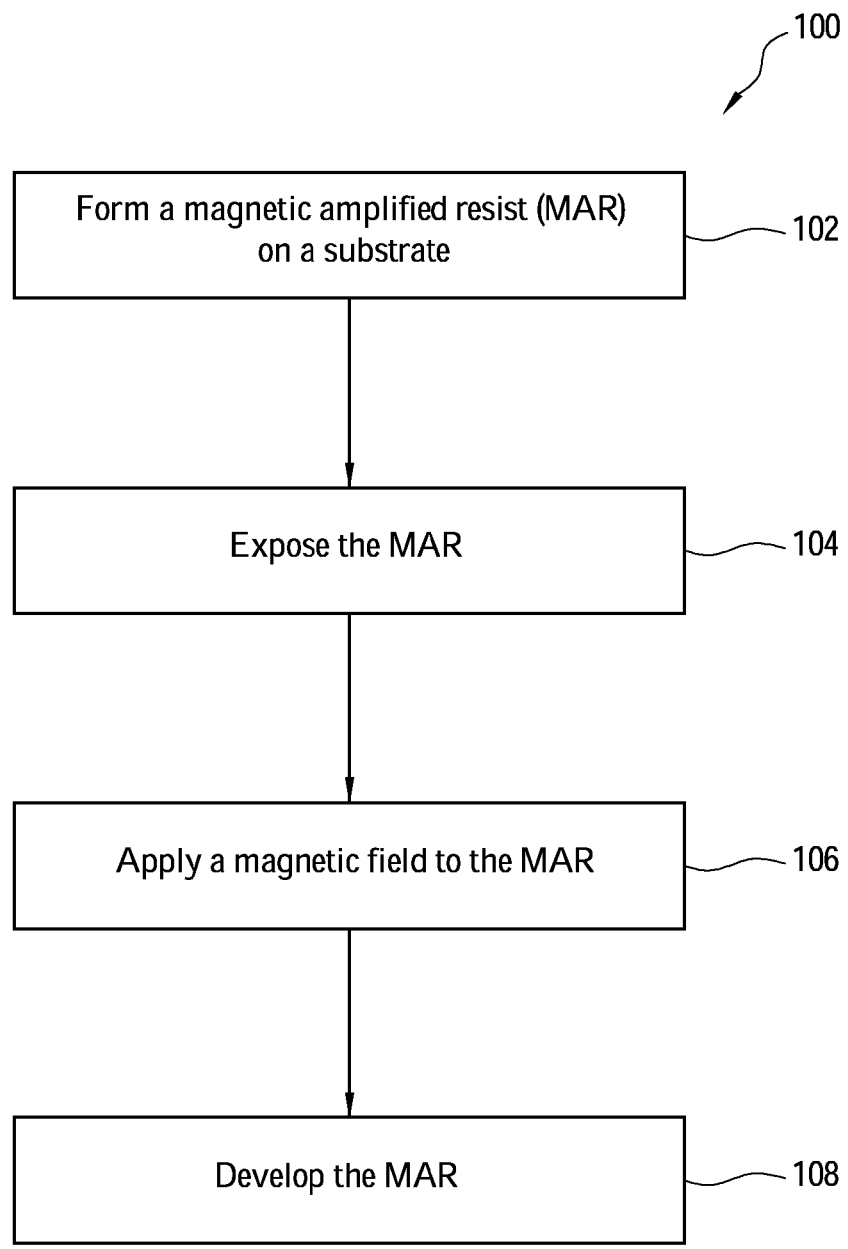
FIG. 1 is a flowchart of one embodiment of a method of lithography patterning utilizing magnetically-amplified resist.

It is understood that the following disclosure provides many different embodiments, or examples, capable of implementing different features of the invention. Specific examples of components and arrangements are described below to simplify and thus clarify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of one embodiment of a method 100 of lithography patterning utilizing magnetically-amplified resist. FIGS. 2 through 5 illustrate sectional views of one exemplary semiconductor device 200 utilizing magnetically-amplified resist during various stages of a lithography patterning process. FIG. 6 illustrates a schematic view of one embodiment of a lithography apparatus 300 designed for processing magnetically-amplified resist and utilizing the method 100. With reference to FIGS. 1 through 6, the method 100, the semiconductor device 200 fabricated thereby, the lithography apparatus 300, and the magnetically-amplified resist will be collectively described below.

Figure 2:
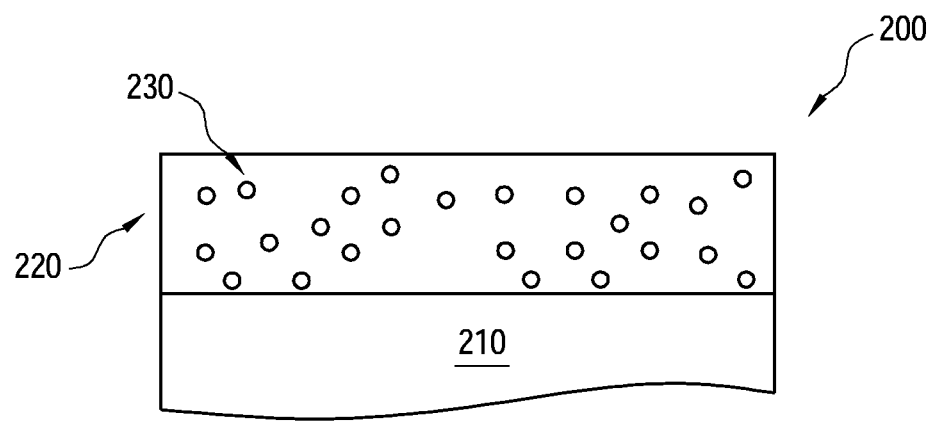
FIGS. 2 through 5 illustrate sectional views of one exemplary semiconductor device utilizing magnetically-amplified resist during various stages of a lithography patterning process.

Referring to FIG. 1 and FIG. 2, the method 100 is initiated at step 102 by forming, on a substrate 210 of the semiconductor device 200, a magnetically-amplified resist (MAR) 220. The semiconductor device 200 may be a semiconductor wafer or other suitable devices. In the present embodiment, the substrate 210 may include silicon. The substrate may alternatively include other suitable semiconductor material, including Ge, SiGe, or GaAs. The substrate may alternatively include a non-semiconductor material such as a glass plate for thin-film-transistor liquid crystal display (TFT-LCD) devices. The substrate 210 may further include other materials such as low k dielectric material, oxide, and conductive material. The substrate 210 may further include one or more material layers to be patterned. Additionally, the substrate 210 may include a bottom anti reflecting coating (BARC).

MAR 220 is formed on the substrate 110. For example, MAR 220 may be formed on a BARC layer of the substrate 210. In the present embodiment, MAR 220 has a thickness ranging between about 50 angstroms and 5000 angstroms. In another embodiment, MAR 220 may have a thickness ranging between about 500 angstroms and 2000 angstroms. The formation of MAR 220 may be implemented by a technique such as spin-on coating and may be followed by a soft baking process.

MAR 220 includes a polymer material that turns soluble to a developer such as a base solution when the polymer is reacted with acid. Alternatively, MAR 220 includes a polymer material that turns insoluble to a developer such as a base solution when the polymer is reacted with acid. MAR 220 further includes a solvent filling inside the polymer. The solvent may be partially evaporated due to a prior baking process. The MAR 220 also includes a magnetically-amplified generator (MAG) 230, with MAG molecules distributed inside the solvent and/or polymer. When absorbing photo energy (or radiation energy), the MAG 230 decomposes and forms a small amount of acid bonded with a magnetic element (referred to as magnetic acid). In the present embodiment, MAG 230 includes a polycyclic aromatic group. MAG 230 may have a concentration ranging between about 1% and 20% wt of MAR 220. In the present embodiment, MAG 230 is adopted as a replacement to a photo-acid generator (PAG) and is incorporated into polymer to form MAR 230. The magnetic element is chemically or otherwise bonded to MAG 230. Upon absorbing photo energy, the magnetic element is bonded to a corresponding acid formed from MAG.

The magnetic element may include an iron-containing magnetic chemical group. In one embodiment, the magnetic element includes at least one of $Fe_3O_4$ and $Fe_2O_3$. In another embodiment, the magnetic element includes a transitional metal such as $Fe_3O_4$ and/or $Fe_2O_3$ doped with transitional metal ions. In another embodiment, the magnetic element includes atoms in 1A, 2A, or 3A groups of the Periodic Table of the Elements, such as Na, K, Mg, Ca, Al, or Ga. Alternatively, the magnetic element may include Fe, Co, Ni, Sc, Ti, V, Cr, Mn, Cu, Zn, Na, K, Mg, Ca, Al, Ga, compounds thereof, or combinations thereof. The magnetic element may have a linear size ranging between about 0.1 micrometer and 10 micrometer. The magnetic element may include a composite structure such as an organic compound with iron oxide physically or otherwise bonded to or enclosed by the organic compound.

In furtherance of the present embodiment, MAR 220 also includes a quencher material (not shown) that distributes inside the solvent and polymer. The quencher may be a base type and is capable of neutralizing acid. Collectively or alternatively, the quencher may inhibit other active component of MAR 220, such as inhibiting MAG 230 and acid. The quencher may have a concentration ranging between 0.5% and 10% wt of MAR 220. In one example, the quencher includes a magnetic element bonded thereto, similar to the magnetic element bonded to MAG 230.

Figure 3:
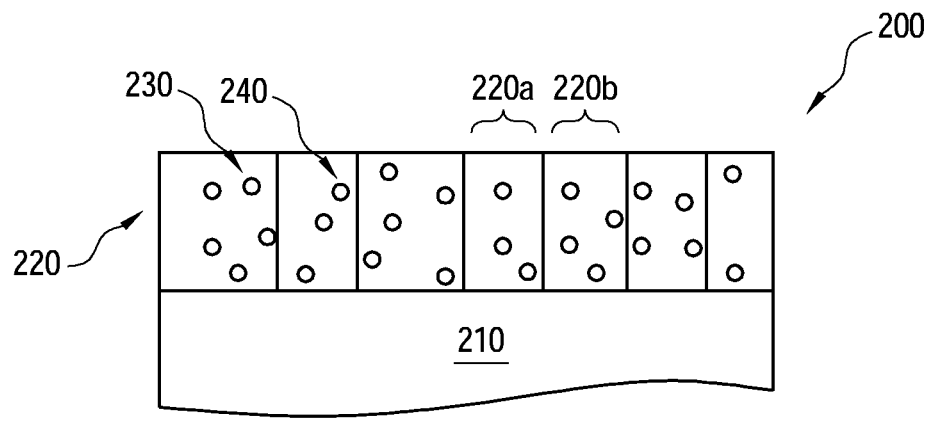

Referring to FIG. 1 and FIG. 3, the method 100 proceeds to step 104 by exposing the MAR 230 to photo energy. At step 104 during a photolithographic patterning process, MAR 220 is exposed to a radiation energy such as deep ultra-violet (DUV) through a photomask (mask or reticle) having a predefined pattern, resulting in a resist pattern that includes a plurality of unexposed regions such as unexposed features 220a and a plurality of exposed regions such as exposed features 220b. The radiation energy may include a 193 nm beam by Argon Fluoride (ArF) excimer lasers, or a 157 nm beam by Fluoride (F2) excimer lasers. The exposed MAG 230 in the MAR 220 is decomposed as anion and acid 240, resulting in the MAR being more soluble to water than unexposed MAR. The acid 240 generated by photo energy from MAG 230 in the exposed regions 220a includes magnetic element bonded thereto, and is therefore referred to as magnetic acid (MA) as mentioned above. The exposing process may be implemented by a lithography tool such as a scanner, a stepper, a wet lithography tool, or a cluster tool capable of photo exposing and applying a magnetic field to MAR 220, which is further described below.

Figure 4:
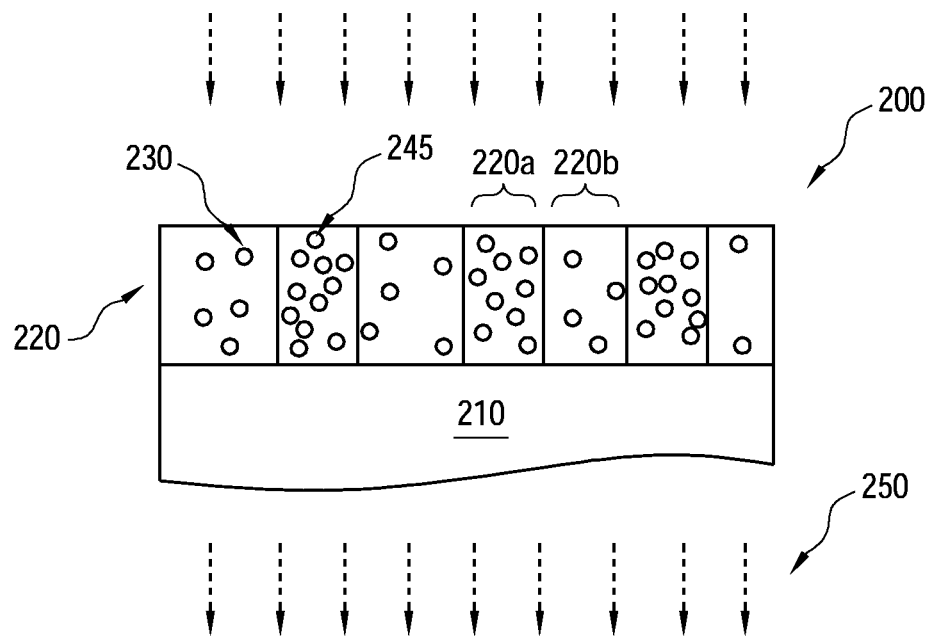

Referring to FIGS. 1 and 4, the method 100 proceeds to step 106 by applying a magnetic field 250 to MAR 220. The magnetic field is designed so that the magnetic acid 240 in the exposed regions of MAR 220 is driven to move up and down substantially along a z-axis perpendicular to the plane of the substrate 210. In the present embodiment, the magnetic field 250 changes directions up and down periodically or randomly, and has a gradient in magnitude along the z-axis. In such a way, the magnetic acid is controlled to move up and down along the z-axis in the exposed regions of MAR 220 to cause chemical amplification, which results in more acid 245 being formed in the exposed regions, increasing the solubility of MAR 230 of the exposed regions when placed in a developer. Since chemical amplification is introduced by (or partially introduced by) the magnetic field 250 instead of a high temperature baking (such as a post exposure baking), lateral diffusion of the magnetic acid 240 is reduced. Furthermore, the chemical amplification reaction duration is shortened. For example, the magnetic field 250 applied to the MAR 220 may have a duration less than a few minutes, such as somewhere between about 10 seconds and 60 seconds. As a result of the shortened duration, the diffusion of the magnetic acid 240 is further reduced and the diffusion of the acid 245 formed by the chemical amplification is also reduced. The lithography patterning resolution is enhanced accordingly.

The magnetic field 250 can be provided by a magnet device or a cluster tool such as a cluster lithography apparatus 300 schematically illustrated in FIG. 6. The cluster lithography apparatus 300 is designed to be operable to provide a magnetic field such as the magnetic field 250 described above. The apparatus 300 includes a substrate stage 310 designed to secure a substrate 320 to be processed by the apparatus 300 for patterning. The substrate stage 310 is operable to move the substrate relative to the apparatus 300. For example, the substrate stage 310 is capable of translational and/or rotational displacement for substrate alignment, stepping, and scanning. The substrate stage 310 may include various components suitable to perform precise movement. A substrate to be held by the substrate stage 310 and processed by the apparatus 300 may be a semiconductor wafer such as the semiconductor device 200.

The apparatus 300 includes one or more imaging lens systems (referred to as a "lens system") 330. The substrate 320 may be positioned on the substrate stage 310 under the lens system 330. The lens system 330 may further include or be integral to an illumination system (e.g., a condenser) which may have a single lens or multiple lenses and/or other lens components. For example, the illumination system may include microlens arrays, shadow masks, and/or other structures. The lens system 330 may further include an objective lens which may have a single lens element or a plurality of lens elements. Each lens element may include a transparent substrate and may further include a plurality of coating layers. The transparent substrate may be a conventional objective lens, and may be made of fused silica (SiO2), calcium-fluoride (CaF2), lithium fluoride (LiF), barium fluoride (BaF2), or other suitable material. The materials used for each lens element may be chosen based on the wavelength of light used in the lithography process to minimize absorption and scattering.

The apparatus 300 may include an immersion fluid retaining module 340 designed for holding an immersion fluid 350 and/or other proper fluid such as a cleaning fluid. The module 340 may be positioned proximate (such as around) the lens system 330 and designed for other functions, in addition to holding the immersion fluid. The immersion fluid to be utilized in the apparatus 300 may include water (water solution or de-ionized water-DIW), gas, or other suitable fluid. The module 340 may include various apertures (or nozzles) for providing an immersion fluid for an exposure process, and/or performing other proper functions. For example, the module 340 may include an aperture 342 as an immersion fluid inlet to provide and transfer the immersion fluid into a space between the lens system 330 and the substrate 320 on the substrate stage 310.

The apparatus 300 may further include a radiation source. The radiation source may be a suitable ultraviolet (UV) or extra UV(EUV) light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm). The apparatus 300 may include a chamber to provide a vacuum environment or a low pressure environment with inert gas for protecting various components and a substrate to be processed.

The apparatus 300 may include a photomask for use during a lithography process. The mask may include a transparent substrate and a patterned absorption layer. The transparent substrate may use fused silica (SiO2) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN.

In the present embodiment, the apparatus 300 includes a magnetic module 360 designed to provide a magnetic field, such as the magnetic field 250 in FIG. 4, to a substrate on the substrate stage 310. The magnetic module 360 is mechanically attached to the apparatus 300. In the present embodiment, the magnetic module 360 is attached to the module 340. The magnetic module 360 may include conductive parts or conductive wires properly designed and configured according to the requirement of the magnetic field 250. The magnetic module 360 may further include or be coupled to an electric power supply to provide the conductive parts or wires with electric current in proper magnitude and frequency in order to realize the magnetic field 250. For example, a conductive wire configured around the module 340 as a magnetic solenoid as illustrated in FIG. 6. The apparatus 300 described above can provide the magnetic field 250 to the magnetic acid 240 in the exposed regions of the MAR 220 at step 106. The apparatus 300 can also be used to perform exposing process to the MAR 220 at step 104. Alternatively, steps 104 and 106 may be combined to be implemented concurrently to MAR 220. The apparatus 300 may further include a module to provide high temperature for baking a substrate on the substrate stage 310.

Referring to step 106 of the method 100, a baking process may be additionally implemented before, during, and/or after the application of the magnetic field 250 to the MAR 220 at step 106. The accompanying baking process may have a temperature lower and a duration less than those of a conventional post exposure baking process for enhanced performance and accelerated throughput.

Figure 5:
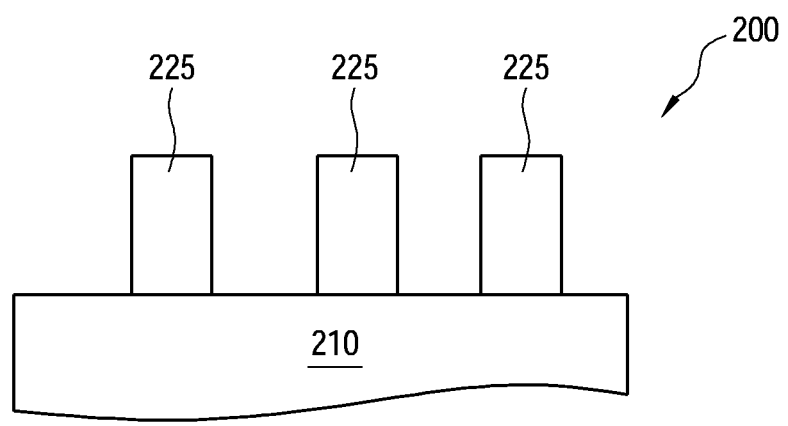
Figure 6:
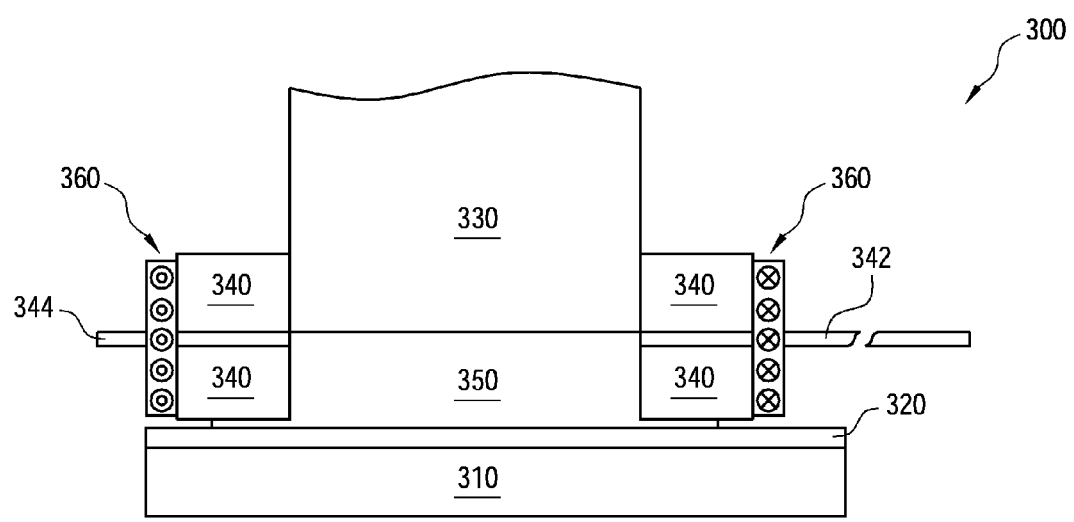
FIG. 6 illustrates a schematic view of one embodiment of a lithography apparatus designed for processing magnetically-amplified resist and utilizing the method of FIG. 1.

Referring to FIGS. 1 and 5, the method 100 then proceeds to step 108 to develop the MAR layer 220 in a developer. The MAR in the exposed regions are substantially dissolved. The developer may be a tetramethylammonium hydroxide (TMAH) based solution. As one alternative, magnetic element may be bonded to the developer in chemical or ionic bond, in order to neutralize or eliminate magnetic element in the MAR layer 220 after the developing process. The method 100 may further include other processing steps after the developing of MAR 220 at step 108, such as baking, etching/implanting, and/or stripping the MAR layer.

The present disclosure provides a material, a method, and an apparatus for lithography patterning. The present disclosure may have various variations without departure from the spirit of the present disclosure. In one example, the apparatus 300 may be reduced to only provide the magnetic field and perform step 106 of the method 100. In another example, the apparatus 300 may be reduced to provide both a high temperature and a magnetic field to the MAR layer on a substrate. In other embodiments for implementing the disclosed material, method, and/or apparatus, it is not limited to patterning a semiconductor substrate. Other substrate such as a glass substrate for TFT_LCD devices, or a transparent substrate (such as fused quartz) for photomask may be patterned using the disclosed material, method, and apparatus. In another variation, the exposing process at step 104 may be implemented by techniques such as maskless photolithography, x-ray lithography, electron-beam writing, or ion-beam writing.

As an alternative to the disclosed material, method, and apparatus, ferroelectric material may be utilized. The alternative material, referred to as electrically amplified resist, includes a polymer material that turns soluble to a developer such as a base solution when the polymer is reacted with acid; a solvent filling inside the polymer; and an electrically-amplified generator (EAG). EAG molecules are distributed inside the solvent and/or polymer. When absorbing photo energy, the EAG decomposes and forms a small amount of acid with electric element (referred to as electric acid). The electric element may be other proper material with electric dipole moment in addition to ferroelectric material and is chemically or otherwise bonded to EAG. In the alternative method, step 106 will be replaced by applying an electric field to the electrically-amplified resist layer. The electric field is designed operable to drive the electric acid up and down along the z-axis perpendicular to the substrate plane, resulting in chemical amplification to form more acid in the exposed regions of the electrically-amplified resist. The alternative apparatus is designed to provide an electric field, instead of a magnetic field, along the z-axis with proper magnitude and frequency capable of driving electric acid accordingly.

Thus, the present disclosure provide a material for use in lithography processing. The material includes a polymer that turns soluble to a base solution in response to reaction with acid; and a plurality of magnetically amplified generators (MAGs) each having a magnetic element and decomposes to form acid bonded with the magnetic element in response to radiation energy.

In some embodiments, the magnetic element may include an iron-containing magnetic chemical group. In other embodiments, the magnetic element may include at least one of $Fe_3O_4$ and $Fe_2O_3$. The magnetic element may include at least one of $Fe_3O_4$ and $Fe_2O_3$ doped with transitional metal ions. The magnetic element may include a group selected from the group consisting of Fe, Co, Ni, Sc, Ti, V, Cr, Mn, Cu, Zn, Na, K, Mg, Ca, Al, Ga, compounds thereof, and combinations thereof. The magnetic element may have a linear size ranging between about 0.1 micrometer and 10 micrometer. The magnetic element may include a composite structure. The magnetic element may be chemically bonded to one of the plurality of MAGs. The material may further include a plurality of quenchers that are capable of neutralizing acid. The plurality of quenchers may include second magnetic element bonded thereto. The plurality of MAGs each may include a polycyclic aromatic group.

The present disclosure also provide a method for photolithography. The method includes forming a photo sensitive layer on a substrate. The photo sensitive layer includes a polymer that turns soluble to a base solution in response to reaction with acid; and a plurality of magnetically amplified generators (MAGs) that decompose to form acid associated with magnetic elements in response to radiation energy. The method further includes exposing the photo sensitive layer to a radiation energy; applying a magnetic field to the photo sensitive layer on the substrate; and developing the exposed photo sensitive layer.

In some embodiments, the applying of the magnetic field may include applying a magnetic field perpendicular to the substrate. The applying of the magnetic field may include applying an alternating magnetic field changing amplitude and direction at a predefined frequency. The forming of the photo sensitive layer may include forming the photo sensitive layer in a multilevel structure. The method may further include baking the photo sensitive layer between the exposing and the developing steps. The baking may occur at least partially concurrent with the applying the magnetic field. The substrate may be selected from the group consisting of a semiconductor substrate, a photomask substrate, and thin-film-transistor liquid-crystal-display (TFT-LCD) substrate. The exposing of the photo sensitive layer may include performing the exposing in an immersion lithography environment.

The present disclosure also provides an apparatus for lithography processing. The apparatus includes a chamber; a substrate stage in the chamber operable to hold a substrate; and a magnetic module configured to provide a magnetic field to the substrate on the substrate stage. In some embodiments, the apparatus may further includes a radiation energy source; and an objective lens configured to receive radiation energy form the radiation energy source and direct the radiation energy toward the substrate positioned on the substrate stage. The magnetic module may be designed to provide the magnetic field tunable and alternating. The magnetic module may be configured to provide the magnetic field perpendicular to a substrate positioned on the substrate stage. The apparatus may further include a baking module to heat a substrate positioned on the substrate stage. The apparatus may further include a fluid module configured to provide a fluid and hold thereof for immersion lithography processing.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A material for use in lithography processing, comprising:
    a polymer that turns soluble to a base solution in response to reaction with acid;
    a plurality of magnetically amplified generators (MAGs) each having a photo-acid generator (PAG) bonded to a magnetic element and each configured to decompose to form acid bonded with the magnetic element in response to a radiation energy, wherein the magnetic element comprises at least one of $Fe_3O_4$ and $Fe_2O_3$ doped with transitional metal ions; and;
    a plurality of quenchers that are capable of neutralizing acid.

2. The material of claim 1, wherein the magnetic element comprises an iron-containing magnetic chemical group.

3. The material of claim 1, wherein the magnetic element comprises at least one of $Fe_3O_4$ and $Fe_2O_3$.

4. The material of claim 1, wherein the magnetic element comprises a component selected from the group consisting of Fe, Co, Ni, Se, Ti, V, Cr, Mn, Cu, Zn, Na, K, Mg, Ca, Al, Ga, compounds thereof, and combinations thereof.

5. The material of claim 1, wherein the magnetic element has a linear size ranging between about 0.1 micrometer and 10 micrometer.

6. The material of claim 1, wherein the magnetic element comprises a composite structure.

7. The material of claim 1, wherein the magnetic element is chemically bonded to one of the plurality of MAGs.

8. The material of claim 1, wherein the plurality of quenchers comprise second magnetic elements bonded thereto.

9. The material of claim 1, wherein the plurality of MAGs each comprises a polycyclic aromatic group.

10. A material for use in lithography processing, comprising:
    a polymer;
    a magnetically amplified generator (MAG) that forms an acid in response to radiation; and
    a magnetic element that is bonded to the MAG, wherein the magnetic element comprises at least one of $Fe_3O_4$ and $Fe_2O_3$ doped with transitional metal ions.

11. The material of claim 10, further including a quencher having a further magnetic element bonded thereto.

12. The material of claim 10, wherein in response to the radiation, the magnetic element is bonded to the acid formed by the MAG.

13. The material of claim 10, wherein the magnetic element contains material that is selected from the group consisting of: Fe, Na, K, Mg, Ca Al, Ga, Co, Ni, Se, Ti, V, Cr, Mn, Cu, Zn, Na, K, Mg, Ca Al, compounds thereof, and combinations thereof.

14. The material of claim 10, wherein the magnetic element includes a composite structure.

15. The material of claim 10, wherein the magnetic element has a linear size ranging between about 0.1 micrometer and about 10 micrometers.

16. A method, comprising:
    forming a photo sensitive material over a wafer, the photo sensitive material including a magnetically amplified generator (AMG) and a magnetic element, wherein the magnetic element comprises at least one of $Fe_3O_4$ and $Fe_2O_3$ doped with transitional metal ions;
    exposing the photo sensitive material to radiation; and
    developing the exposed photo sensitive material.

17. The method of claim 16, further including: placing the photo sensitive material in a magnetic field.

18. The method of claim 16, wherein the exposing the photo sensitive material is carried out in a manner such that in response to the radiation, the MAG releases an acid, and wherein the acid is bonded to the magnetic element.

19. The method of claim 16, wherein the forming the photo sensitive material is carried out in a manner such that:
    the photo sensitive material includes a quencher; and
    the magnetic element contains material that is selected from the group consisting of: fe, Na, K, Mg, Ca, Al, Ga, Co, Ni, Se, Ti, V, Cr, Mn, Cu, Zn, Na, K, Mg, Ca, Al, compounds thereof, and combinations thereof.

* * * * *